(12) United States Patent
Kao et al.

(10) Patent No.: US 11,094,508 B2
(45) Date of Patent: Aug. 17, 2021

(54) FILM STRESS CONTROL FOR PLASMA ENHANCED CHEMICAL VAPOR DEPOSITION

(71) Applicant: Applied Materials, Inc., Santa Clara, CA (US)

(72) Inventors: Chien-Teh Kao, Sunnyvale, CA (US); Tae Kyung Won, San Jose, CA (US); Carl A. Sorensen, Morgan Hill, CA (US); Sanjay D. Yadav, San Jose, CA (US); Young Dong Lee, Hwaseong-Si (KR); Shinichi Kurita, San Jose, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/221,322

(22) Filed: Dec. 14, 2018

(65) Prior Publication Data

US 2020/0194233 A1     Jun. 18, 2020

(51) Int. Cl.
*H01J 37/32*     (2006.01)
*H01L 21/683*     (2006.01)
(Continued)

(52) U.S. Cl.
CPC .. *H01J 37/32449* (2013.01); *C23C 16/45565* (2013.01); *C23C 16/52* (2013.01);
(Continued)

(58) Field of Classification Search
CPC ........... H01J 37/32449; H01J 37/32174; H01J 37/32458; H01J 37/32715;
(Continued)

(56) References Cited

U.S. PATENT DOCUMENTS 5,580,385 A * 12/1996 Paranjpe .................. H05H 1/46
                                                      118/723 I
5,716,451 A * 2/1998 Hama .................... H01J 37/321
                                                       118/723 I
(Continued)

FOREIGN PATENT DOCUMENTS

EP          0693770 A1     1/1996
JP         H06053137 A     2/1994
(Continued)

OTHER PUBLICATIONS

International Search Report and Written Opinion for Application No. PCT/US2019063375 dated Mar. 20, 2020.

*Primary Examiner* — Benjamin Kendall
(74) *Attorney, Agent, or Firm* — Patterson + Sheridan LLP

(57) ABSTRACT

Embodiments of the present disclosure include methods and apparatus for depositing a plurality of layers on a large area substrate. In one embodiment, a processing chamber for plasma deposition is provided. The processing chamber includes a showerhead and a substrate support assembly. The showerhead is coupled to an RF power source and a ground and includes a plurality of perforated gas diffusion members. A plurality of plasma applicators is disposed within the showerhead, wherein one plasma applicator of the plurality of plasma applicators corresponds to one of the plurality of perforated gas diffusion members. Further, a DC bias power source is coupled to a substrate support assembly.

20 Claims, 5 Drawing Sheets

(51) Int. Cl.
*C23C 16/455* (2006.01)
*C23C 16/52* (2006.01)
*H01L 21/02* (2006.01)

(52) U.S. Cl.
CPC ...... *H01J 37/321* (2013.01); *H01J 37/32174* (2013.01); *H01J 37/32458* (2013.01); *H01J 37/32715* (2013.01); *H01L 21/02274* (2013.01); *H01L 21/6833* (2013.01); *H01J 2237/3321* (2013.01)

(58) Field of Classification Search
CPC . H01J 2237/3321; H01J 37/321–32119; H01J 37/3244–32449; H01L 21/02274; H01L 21/68833; H01L 21/3321; H01L 21/6833; C23C 16/452; C23C 16/45565; C23C 16/45572; C23C 16/4586; C23C 16/505; C23C 16/52
See application file for complete search history.

(56) References Cited

U.S. PATENT DOCUMENTS

| | | | |
|---|---|---|---|
| 5,858,471 A | 1/1999 | Ray et al. | |
| 6,089,182 A * | 7/2000 | Hama | C23C 16/00 118/723 AN |
| 6,203,620 B1 * | 3/2001 | Moslehi | H01J 37/321 118/723 R |
| 6,244,211 B1 * | 6/2001 | Nishikawa | C23C 16/4401 118/723 AN |
| 6,245,202 B1 * | 6/2001 | Edamura | H05H 1/46 204/298.06 |
| 6,537,421 B2 | 3/2003 | Drewery | |
| 6,682,630 B1 | 1/2004 | Colpo et al. | |
| 6,926,926 B2 | 8/2005 | Cho et al. | |
| 7,341,959 B2 | 3/2008 | Brcka | |
| 7,422,636 B2 | 9/2008 | Ishizaka | |
| 2002/0092618 A1 * | 7/2002 | Collins | H01J 37/32458 156/345.48 |
| 2007/0186855 A1 * | 8/2007 | Dhindsa | H01J 37/32642 118/723 E |
| 2009/0107955 A1 * | 4/2009 | Tiner | H01J 37/32834 216/67 |
| 2011/0204023 A1 * | 8/2011 | Huh | H01J 37/321 216/37 |
| 2011/0278260 A1 * | 11/2011 | Lai | H01J 37/32532 216/68 |
| 2014/0292193 A1 * | 10/2014 | Chang | H01J 37/32165 315/34 |
| 2014/0370715 A1 * | 12/2014 | Chung | H01J 37/32174 438/714 |
| 2017/0092470 A1 * | 3/2017 | Ramaswamy | H01J 37/32091 |
| 2017/0213758 A1 * | 7/2017 | Rice | H01J 37/32715 |
| 2017/0314132 A1 | 11/2017 | Kim et al. | |
| 2019/0085458 A1 * | 3/2019 | Tsuno | H01J 37/32422 |

FOREIGN PATENT DOCUMENTS

| | | |
|---|---|---|
| KR | 100712124 B1 | 4/2007 |
| WO | 2007089216 A1 | 8/2007 |

\* cited by examiner

FILM STRESS CONTROL FOR PLASMA ENHANCED CHEMICAL VAPOR DEPOSITION

BACKGROUND

Field

Embodiments of the present disclosure generally relate to methods and apparatus for processing large area substrates. More specifically, embodiments of the present disclosure relate to chemical vapor deposition systems for device fabrication and methods thereof.

Description of the Related Art

In the manufacture of displays, many processes are employed to deposit thin films on substrates, such as liquid crystal display (LCD) and/or organic light emitting diode (OLED) substrates, to form electronic devices thereon. The deposition is generally accomplished by introducing a precursor gas into a vacuum chamber having a substrate disposed on a temperature controlled substrate support. The precursor gas is typically directed through a gas distribution plate situated near the top of the vacuum chamber. The precursor gas in the vacuum chamber may be excited into a plasma by applying a radio frequency (RF) power to a conductive showerhead disposed in the chamber from one or more RF sources coupled to the chamber. The excited gas reacts to form a layer of material on a surface of the substrate that is positioned on the temperature controlled substrate support.

Traditionally, plasma is formed in conventional chambers for deposition on large area substrates using a capacitively coupled electrode arrangement. Lately, interest in multi-coil inductively coupled plasma arrangements (ICP), historically utilized in deposition on round substrates or wafers, has been explored for use in deposition processes for these large area substrates. In such inductively coupled plasma arrangements used in large area high density plasma chemical vapor deposition (HDP-CVD), RF power may be applied below the substrate in order to modulate intrinsic film stress of individual film layers of the fabricated semiconductor device. Lower intrinsic film stress is desired to reduce damaging of films (e.g., cracking and debonding of films) in respect to the finished device. However, conventional inductively coupled arrangements utilize dielectric materials which enable the RF power applied below the substrate to penetrate through a plasma processing region and couple with a conductive showerhead frame disposed above. The penetration of the RF power into the processing region causes variance of stress characteristics between areas of films deposited directly underneath showerhead coils and those deposited directly underneath the showerhead frame.

Accordingly, what is needed in the art are improved methods and apparatus for modulating film stress during large area high density plasma vapor deposition.

SUMMARY

Embodiments of the present disclosure relate to methods and apparatus for processing large area substrates. More specifically, embodiments of the present disclosure relate to chemical vapor deposition systems for device fabrication, and methods thereof.

In one embodiment, a plasma deposition chamber is provided. The plasma deposition chamber includes a showerhead, a plurality of dielectric plates, a plurality of inductive coils, and a substrate support assembly. The showerhead includes a plurality of perforated members each coupled to one or more of a plurality of support members. The support members provide precursor gases to a volume formed between the inductive coils and the perforated members. The substrate support assembly includes an electrostatic chuck assembly, an insulation layer, and a substrate bias plate. The substrate bias plate is coupled to a DC type power source and a low pass filter.

In one embodiment, a plasma deposition chamber is provided. The plasma deposition chamber includes a showerhead having a plurality of perforated members, an inductive coupler corresponding to one or more of the plurality of perforated members, a plurality of support members for supporting each of the perforated members, and a substrate support assembly. One or more of the support members provides precursor gases to a volume between the inductive couplers and the perforated members. The substrate support assembly includes an electrostatic chuck assembly, an insulation layer, and a substrate bias plate. The substrate bias plate is coupled to a DC type power source and a low pass filter.

In one embodiment, a method for depositing films on a substrate is provided. The method includes flowing a precursor gas to a plurality of gas volumes of a showerhead, varying the flow of the precursor gas into each of the gas volumes, applying an RF power to inductive coils of the showerhead to energize the precursor gas, flowing the energized precursor gas into a processing region of a processing chamber, and applying a DC bias power to a bias plate within a substrate support to modulate film deposition on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
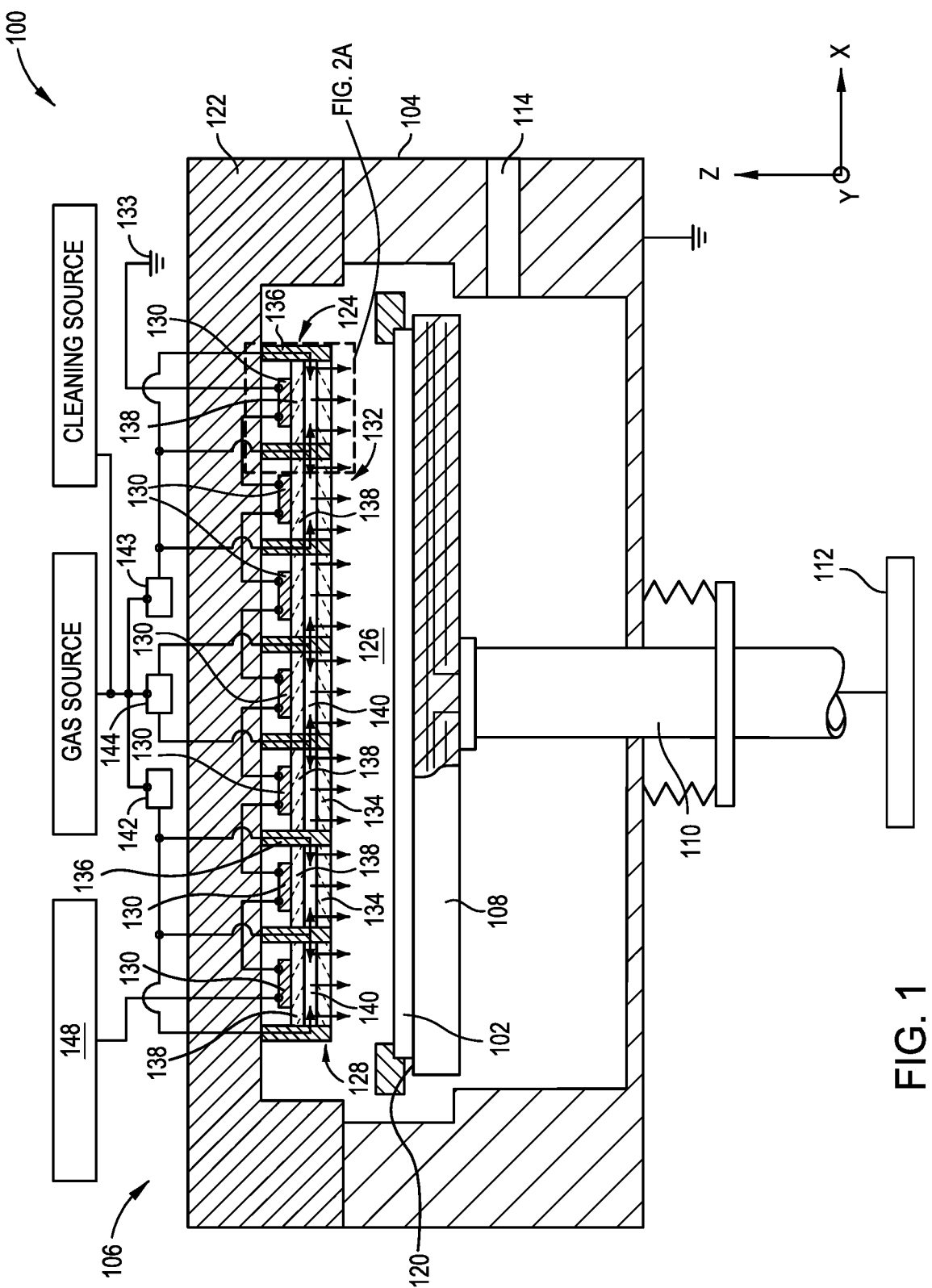
FIG. 1 illustrates a cross sectional view of a processing chamber, according to one embodiment of the present disclosure.

Embodiments of the present disclosure include methods and apparatus for depositing a plurality of layers on a large area substrate. In one embodiment, a processing chamber for plasma deposition is provided. The processing chamber includes a showerhead and a substrate support assembly. The showerhead is coupled to an RF power source and ground and includes a plurality of perforated gas diffusion members. A plurality of plasma applicators is disposed within the showerhead, wherein one plasma applicator of the plurality of plasma applicators corresponds to one of the plurality of perforated gas diffusion members. Further, a DC bias power source is coupled to a substrate support assembly.

A large area substrate as used herein is a substrate having a surface area of typically about 1 square meter, or greater. However, the substrate is not limited to any particular size or shape. In one aspect, the term "substrate" refers to any polygonal, square, rectangular, curved, or otherwise non-circular workpiece, such as a glass or polymer substrate used in the fabrication of flat panel displays, for example.

Herein, a showerhead is configured to flow gas therethrough and into a processing volume of a chamber in a number of independently controlled zones, in order to improve the uniformity of the processing of the surface of a large area substrate exposed to the gas in the processing zone. Additionally, each zone is configured with a plenum, one or more perforated members between the plenum and the processing volume of the chamber, and a coil or portion of a coil dedicated to a zone or to an individual perforated plate. The plenum is formed between a dielectric window, a perforated member, and a surrounding frame structure. Each plenum is configured to enable processing gas(es) to be flowed therethrough and distributed to result in a relatively uniform flow rate, or in some cases, a tailored flow rate, of the gases through the perforated member and into the processing volume. The plenum has a thickness less than twice the thickness of a dark space of the a plasma formed of the process gas(es) at the pressures thereof within the plenum. An inductive coupler, preferably in the shape of a coil, is positioned behind the dielectric window, and inductively couples energy through the dielectric window, plenum and perforated member to strike and support a plasma in the processing volume. The flow of the process gas(es) in each zone is controlled to result in uniform or tailored gas flows to achieve desired process results on the large area substrate.

Embodiments of the present disclosure include a high density plasma chemical vapor deposition (HDP-CVD) processing chamber that is operable to form one or more layers or films on a substrate, including large area substrates. The processing chamber, as disclosed herein, may be adapted to deliver energized species of a precursor gas that are generated in a plasma. The plasma may be generated by inductively coupling energy into a gas under vacuum. Embodiments disclosed herein may be adapted for use in chambers that are available from AKT America, Inc., a subsidiary of Applied Materials, Inc., Santa Clara, Calif. It is to be understood that embodiments discussed herein may be practiced in chambers available from other manufacturers as well.

FIG. 1 is a cross sectional view illustrating an exemplary processing chamber 100, according to one embodiment of the present disclosure. A substrate 102 is disposed within a chamber body 104 on a substrate receiving surface 120 of a pedestal or substrate support assembly 108. The substrate support assembly 108 is coupled to a shaft 110 which extends through the chamber body 104. The shaft 110 is coupled to an actuator 112 that moves the substrate support assembly 108 in a vertical direction (in the Z direction) within the chamber body 104. For example, the substrate support assembly 108 of the processing chamber 100 shown in FIG. 1 is illustrated in a processing position. However, the substrate support assembly 108 may be lowered in the Z direction to a position adjacent a transfer port 114. In this position, an end effector or a robot blade (not shown) is inserted through the transfer port 114, and between the substrate 102 and the substrate receiving surface 120, to transfer the substrate 102 out of the chamber body 104.

The processing chamber 100 also includes a lid assembly 106 disposed above the substrate support assembly 108. The lid assembly 106 may include a backing plate 122 that rests on the chamber body 104. The lid assembly 106 includes a gas distribution assembly or showerhead assembly 124 configured to deliver process gases from a gas source to a processing region 126 between the showerhead assembly 124 and the substrate 102. The showerhead assembly 124 may also be coupled to a cleaning gas source that provides cleaning gases, such as fluorine containing gases, to the processing region 126.

The showerhead assembly 124 also functions as a plasma source 128. The showerhead assembly 124 includes one or more inductively coupled plasma generating members, or coils 130. Each of the one or more coils 130 may be a single coil 130, two coils 130, or more than two coils 130 performing conjointly and are simply described as coils 130 hereafter. Each of the one or more coils 130 is coupled to a power source 148 and a ground 133. In one embodiment, the power source 148 is an inductively coupled radio frequency (RF) power source. The power source 148 is configured to provide a power signal at any suitable frequency and power level for plasma generation by the showerhead assembly 124. The first power source may include a match circuit or a tuning capability for adjusting electrical characteristics of the coils 130.

The showerhead assembly 124 further includes a faceplate 132 that has a plurality of gas flow diffusers 134. Each one of the gas flow diffusers 134 is supported by a plurality of support members 136 arranged in a grid-like configuration and includes a plurality of openings 220 (FIG. 2A) through which gas may flow. Each one of the coils 130 or portions of the one or more coils 130 are disposed on or above a respective dielectric plate 138. An example of a coil 130 that is disposed over the dielectric plates 138 within the lid assembly 106 is more clearly shown in FIG. 2A. A plurality of gas volumes 140 is defined by the surfaces of the dielectric plates 138, the gas flow diffusers 134, and the support members 136. Each of the one or more coils 130 is configured to receive an RF signal from the power source 148 and create an electromagnetic field that energizes the process gases into a plasma in the gas volumes 140. The energized process gases in the gas volumes 140 is flowed through the gas flow diffusers 134 into the processing region 126 and towards the substrate 102.

Process gases from the gas source are provided to each of the gas volumes 140 via conduits 200, 205 in the support members 136. The volume or flow rate of gas(es) entering and leaving the showerhead assembly 124 are controlled in different zones of the showerhead assembly 124. Gas flow to each of the gas volumes 140 may be controlled by a plurality of flow controllers, such as flow controllers 142, 143, and 144, as illustrated in FIG. 1. For example, the flow rate of gases to outer or peripheral zones of the showerhead assembly 124 may be controlled by flow controllers 142, 143, while flow rate of gases to an inner or central zone of the showerhead assembly may be controlled by flow controller 144. When chamber cleaning is performed, cleaning gases from a cleaning gas source may be flowed to each of the gas volumes 140 and into the processing volume 140 within which the cleaning gases are energized into ions, radicals, or both. The energized cleaning gases may flow through the gas flow diffusers 134 and into the processing region 126 in order to clean chamber components.

Figure 2A:
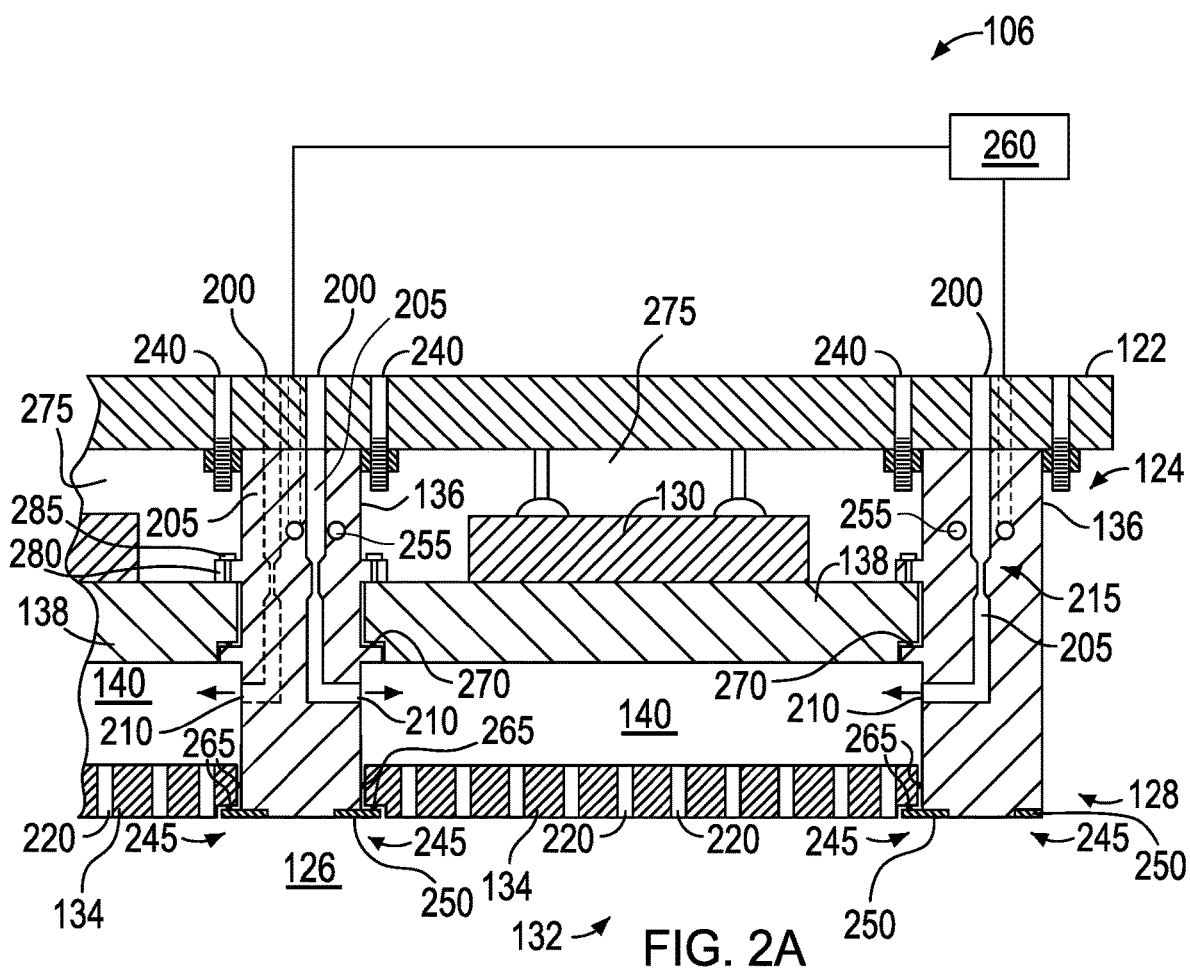
FIG. 2A is an enlarged view of a portion of the lid assembly of FIG. 1.

FIG. 2A is an enlarged view of a portion of the lid assembly 106 of FIG. 1. As previously discussed, precursor gases from the gas source flow to the gas volumes 140 through first conduits 200 formed in the backing plate 122. Each of the first conduits 200 is coupled to second conduits 205 formed through the showerhead frame 136. The second conduits 205 provide the precursor gases to the gas volumes 140 at an opening 210. In some embodiments, some of the second conduits 205 may provide gases to two adjacent gas volumes 140 (one of the second conduits 205 is shown in phantom in FIG. 2A). In some embodiments, the second conduits 205 may include a flow restrictor 215 to control flow to the gas volumes 140. The size of the flow restrictors 215 may be varied in order to control gas flow therethrough. For example, each of the flow restrictors 215 includes an orifice of a particular size (e.g., diameter) that is utilized to control flow. Further, each of the flow restrictors 215 may be changed, as needed, to provide a larger orifice size, or a smaller orifice size, as needed, to control flow therethrough.

As depicted in FIG. 2A, the gas flow diffusers 134 are disposed at a lower end of the gas volumes 140 and include a plurality of openings 220 extending therethrough. Each of the plurality of openings 220 enables gases energized by the coils 130 to flow from the gas volumes 140 into the processing region 126 as plasma at desired flow rates due to the diameter of the openings 220 extending between the gas volume 140 and processing region 126. The openings 220, and/or rows and columns of the openings 220, may be sized differently and/or spaced differently in order to equalize gas flow through each of the openings 220 in one or more of the gas flow diffusers 134. Alternatively, the gas flow from each of the openings 220 may be non-uniform, depending on desired gas flow characteristics.

The support members 136 are coupled to the backing plate 122 by fasteners 240, such as bolts or screws. Each of the support members 136 physically supports and separates the individual gas flow diffusers 134 at an interface portion 245. Each of the interface portions 245 may be a ledge or shelf that supports a perimeter or an edge of the gas flow diffusers 134. In some embodiments, the interface portions 245 include a removable strip 250. The removable strips 250 are fastened to the support members 136 by a fastener (not shown), such as a bolt or screw. A portion of the interface portions 245 is L-shaped while another portion of the interface portions 245 is T-shaped. One or more seals 265 are utilized to seal the gas volumes 140. For example, the seals 265 are elastomeric materials, such as an O-ring seal or a polytetrafluoroethylene (PTFE) joint sealant material. The one or more seals 265 may be provided between the support members 136 and the gas flow diffusers 134. The removable strips 250 are utilized to support the gas flow diffusers 134 onto the support members 136. The removable strips 250 may be removed, as necessary, to replace each gas flow diffuser 134 individually.

In addition, each of the support members 136 supports the dielectric plates 138 utilizing shelves 270 extending therefrom (shown in FIG. 2A). In embodiments of the showerhead assembly 124/plasma source 128, the dielectric plates 138 are smaller in lateral surface area (X-Y plane) as compared to a surface area of the entire showerhead assembly 124/plasma source 128. In order to support the dielectric plates 138, the shelves 270 are utilized. The reduced lateral surface area of the multiple dielectric plates 138 enable the use of dielectric materials as a physical barrier between the vacuum environment and plasma in the gas volume 140 and processing region 126 and the atmospheric environment in which the adjacent coil 130 is typically positioned, without imposing large stresses therein based on a large area supporting the atmospheric pressure load.

Seals 265 are used to seal the volumes 275 (at atmospheric or near atmospheric pressures) from the gas volumes 140 (which are at sub atmospheric pressures in the millitorr or less range during processing. Interface members 280 are shown extending from the support members 136, and fasteners 285 are utilized to fix, i.e., push, the dielectric plates 138 against the seals 265 and the shelves 270. Seals 265 may also be utilized to seal a space between an outer perimeter of the gas flow diffusers 134 and the support members 136.

Materials for the showerhead 124/plasma source 128 are chosen based on one or more of electrical characteristics, strength and chemical stability. The coils 130 are made of an electrically conductive material. The backing plate 122 and the support members 136 are made of a material that is able to support the weight of the supported components and atmospheric pressure load, which may include a metal or other similar material. The backing plate 122 and the support members 136 can be made of a non-magnetic material (e.g., non-paramagnetic or non-ferromagnetic material), such as an aluminum material. The removable strips 250 are also formed of a non-magnetic material such as a metallic material, such as aluminum, or a ceramic material (e.g., alumina ($Al_2O_3$) or sapphire ($Al_2O_3$)). The gas flow diffusers 134 are made of a ceramic material, such as quartz, alumina or other similar material. The dielectric plates 138 are made of a quartz, alumina or sapphire materials.

In some embodiments, the showerhead frame 136 includes one or more coolant channels 255 therein. The one or more coolant channels 255 are fluidly coupled to a fluid source 260 that is configured to provide a coolant medium to the coolant channels 255.

Figure 2B:
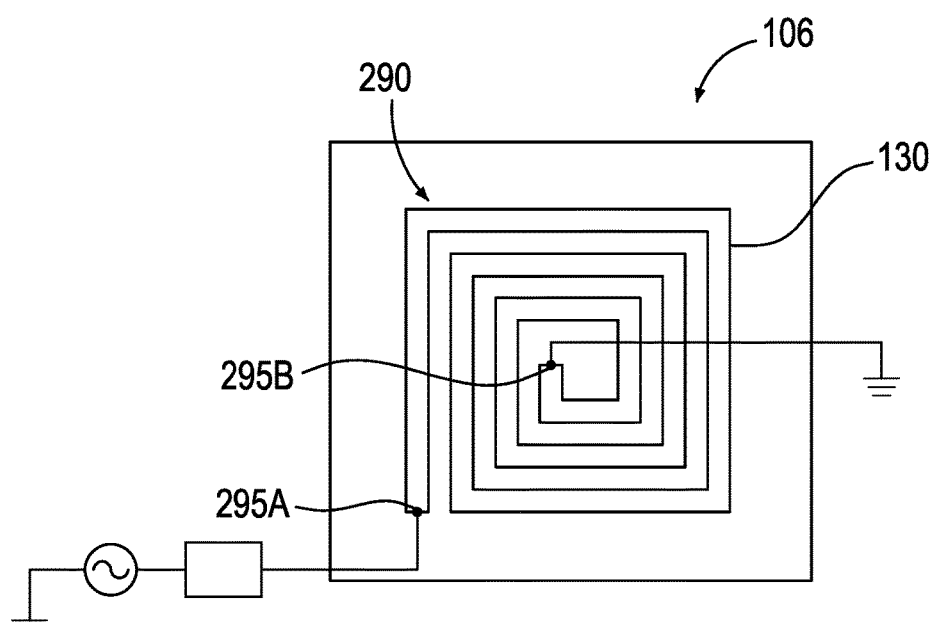
FIG. 2B is a top plan view of one embodiment of a coil.

FIG. 2B is a top plan view of one embodiment of a coil 130 positioned on the dielectric plates 138 found in the lid assembly 106. In one embodiment, the coil 130 configuration shown in FIG. 2B may be used such that the illustrated coil configuration is formed over each of the dielectric plates 138 individually such that each planar coil is connected in series with adjacently positioned coils 130 in a desired pattern across the showerhead assembly 124. The coil 130 includes a conductor pattern 290 that is a rectangular spiral shape. Electrical connections include an electrical input terminal 295A and an electrical output terminal 295B. Each of the one or more coils 130 of the showerhead assembly 124 are connected in series and/or in parallel.

Figure 3:
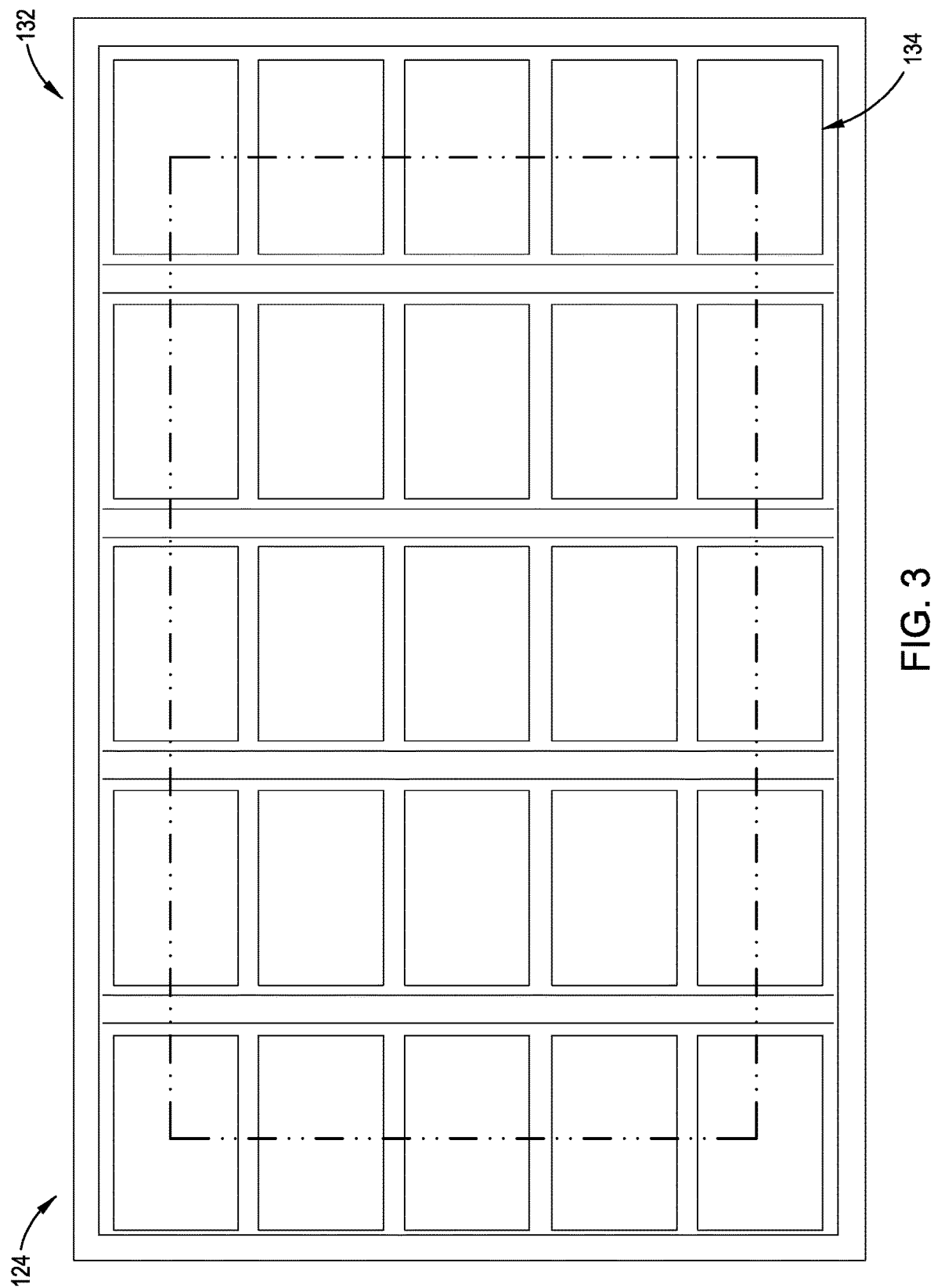
FIG. 3 is a bottom plan view of a faceplate of a showerhead with a superimposed profile of a substrate in relation to the showerhead, according to one embodiment of the present disclosure.

FIG. 3 is a bottom plan view of one embodiment of the faceplate 132 of the showerhead assembly 124. FIG. 3 includes a superimposed profile of the position of substrate 102 on the substrate receiving surface 120 in relation to the showerhead assembly 124 during processing within the processing chamber 100, according to one embodiment of the present disclosure. As described above, the showerhead assembly 124 is configured to include one or more gas flow diffusers 134 supported and separated by a plurality support members 136 arranged in a grid-like frame. Gas is flowed from the gas volumes 140 into the processing region 126 above the substrate 102 via the plurality of openings 220 through each gas flow diffuser 143. The number of coils 130, gas volumes 140, and gas flow diffusers 134 within the showerhead assembly 124 depends on the overall area for film deposition on substrate 102.

Figure 4:
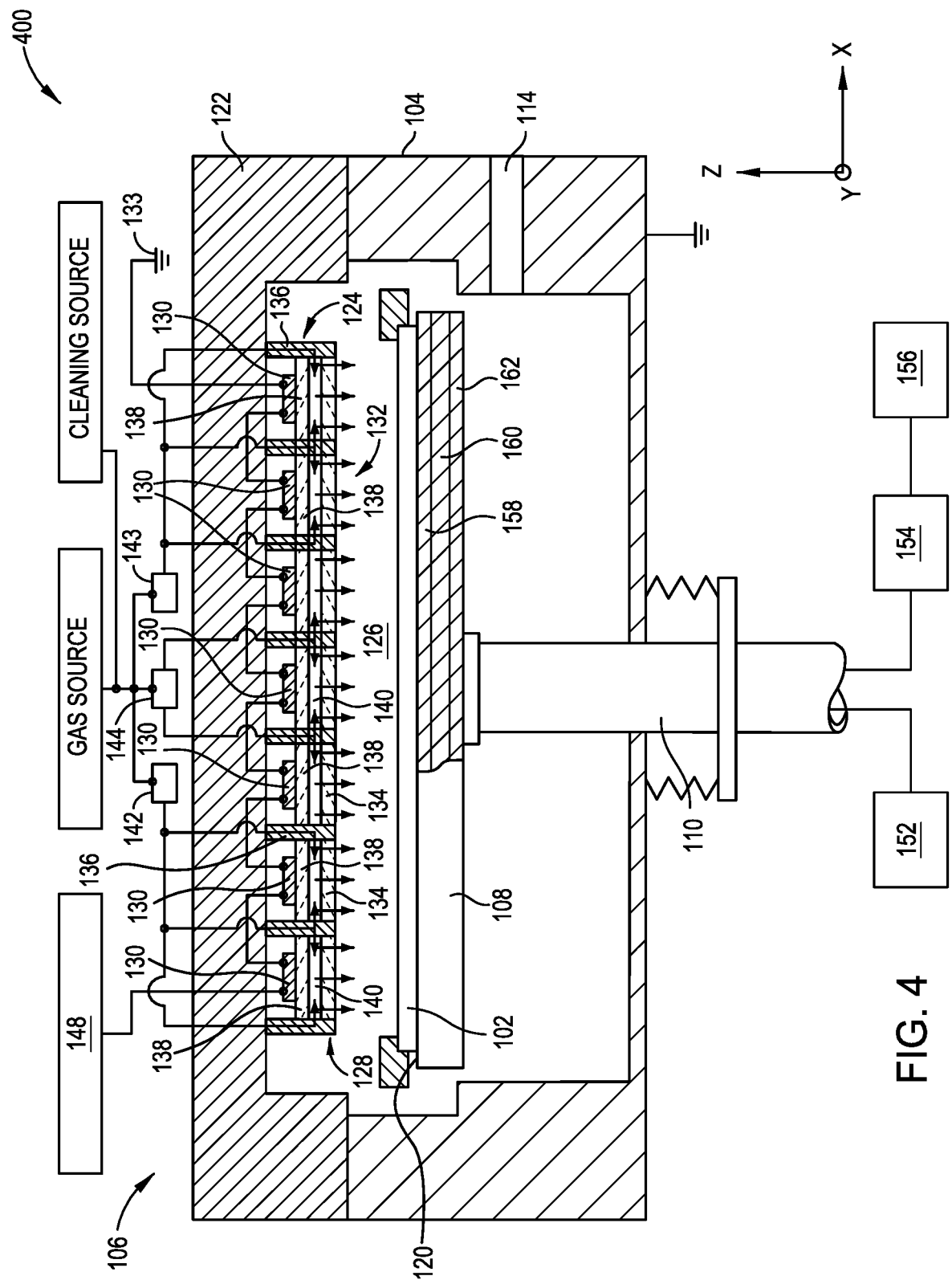
FIG. 4 illustrates a cross sectional view of a processing chamber, according to another embodiment of the present disclosure.

FIG. 4 is a cross sectional view illustrating the processing chamber 400, according to an embodiment of the disclosure. In addition to the features of processing chamber 100 as recited above, the process chamber 400 includes the substrate support assembly 108 having an electrostatic chuck assembly 158, a substrate bias plate 160, and an insulation layer 162.

In one embodiment, the electrostatic chuck assembly 158 is disposed at a top-most position of the substrate support assembly 108, such that the substrate receiving surface 120 corresponds with an upper surface of the electrostatic chuck assembly 158. The electrostatic chuck assembly 158 is coupled to an electrostatic chucking power source 152 disposed outside of the chamber body 104. The electrostatic chucking power source may be any suitable power supply configured to provide desired voltages for electrostatic chucking of the substrate 102 during processing. In addition, the electrostatic chuck assembly 158 may include two or more electrodes disposed in any suitable arrangement selected for chucking a specific substrate device. For example, the electrostatic chuck assembly 158 may include two electrodes arranged in a rectangular spiral, one electrode enclosing the other. In another example, the electrostatic chuck assembly 158 may include two interleaving electrodes forming a circular shape. Each electrode in the electrostatic chuck assembly 158 may be separately powered by electrostatic chucking power source 158, thus enabling the electrodes to be charged with different polarities.

The insulation layer 162 is disposed at a bottom-most position of the substrate support assembly 108. The insulation layer 162 may be formed of a dielectric material such as silicon dioxide ($SiO_2$). The insulation layer 162 shields a line-of-sight path of an electrical field formed by the substrate bias plate 160 to the chamber body 104, thus minimizing the possibility of electrical arcing between the substrate bias plate 160 and the chamber body 104.

The substrate bias plate 160 is disposed between the electrostatic chuck assembly 158 and the insulation layer 162. The substrate bias plate is further coupled to a substrate bias power source 156 and a low pass filter 154 arranged in a linear connection. As depicted in FIG. 4, the substrate bias power source 156 and low pass filter 154 may be disposed outside of the chamber body 104. The substrate bias plate 162 and substrate bias power source 156 are configured to provide an electrical bias below the substrate 102 in order to extract ions from the plasma in processing region 126 towards desired areas of the substrate 102 on the substrate support assembly 108. When used during processing, the extraction of plasma ions towards desired areas of the substrate 102 modulates film deposition such that film characteristics (e.g. film thickness and film stress) may be controlled. For example, the amount (e.g., density) of ions extracted from the plasma may be modulated by adjusting the substrate bias power supplied to certain regions of the substrate surface, thus enabling control of tensile and compressive stress characteristics of films deposited on the substrate 102.

The substrate bias power source 156 is a direct current (DC) type power source that supplies a DC voltage in either a positive or negative polarity. In one embodiment, the substrate bias power source 156 is configured to supply a constant DC bias. In another embodiment, the substrate bias power source 156 is configured to supply a pulsed DC bias. The low pass filter 154 may be configured to prevent RF signals from the power source 148 to couple with the substrate support assembly 108 and pass through to the substrate bias power source 156.

Figure 5:
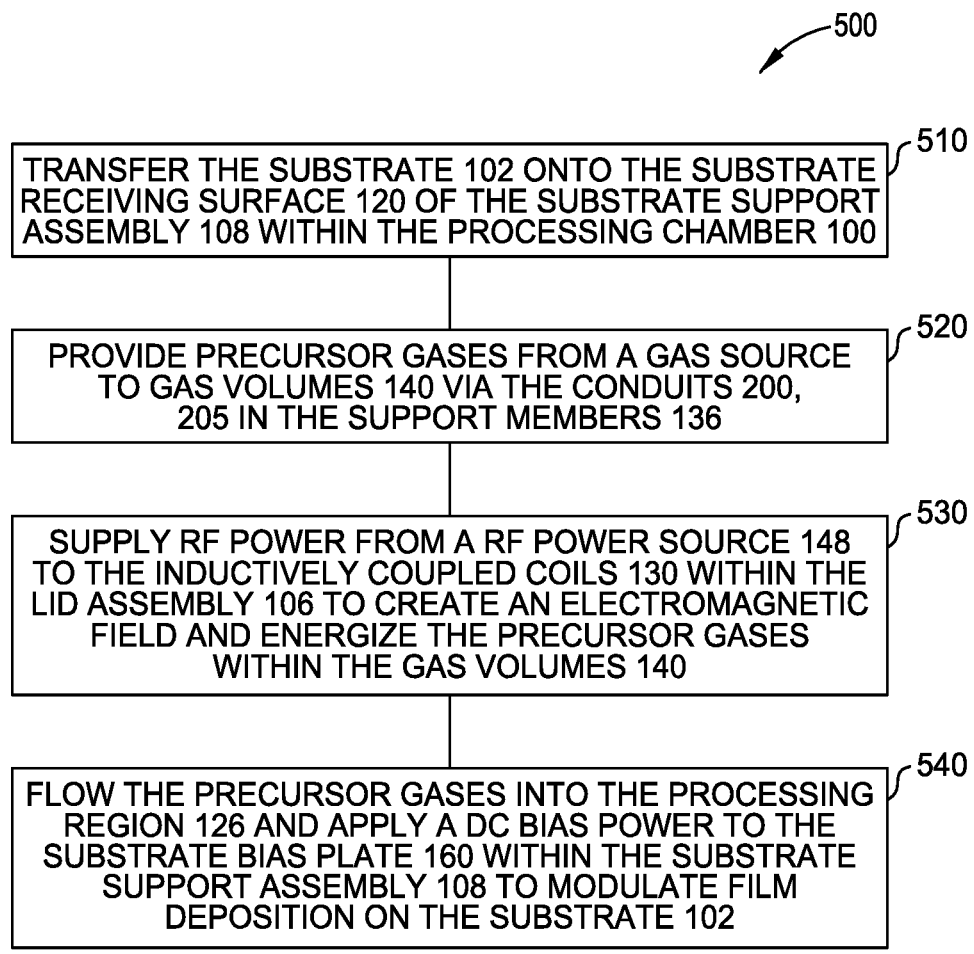
FIG. 5 is a flowchart illustrating operations undertaken in the formation of films deposited in FIG. 4.

FIG. 5 is a flow chart illustrating a method 500 of controlling intrinsic film stress during large area film deposition using the processing chamber 400 of FIG. 4. At operation 510, the substrate 102 is transferred onto the substrate receiving surface 120 of the substrate support assembly 108. The substrate 102 may be transferred into the processing chamber 100 and onto the substrate support assembly 108 by any suitable means, such as by a robot blade through a transfer port 114 located in a side wall of the chamber body 104. The substrate support assembly 108 may then be adjusted to a processing position by an actuator 112 as depicted in FIG. 1.

At operation 520, precursor gases from a gas source are provided to the gas volumes 140 via conduits 200, 205 disposed in the support members 136. The flow of the precursor gases may be controlled by several flow controllers 142, 143 which control the amount and velocity of gas provided to each gas volume 140.

At operation 530, the power source 148 supplies RF power to the inductively coupled coils 130 within the lid assembly 106. The RF power may be supplied at any suitable frequency or power level for plasma generation. For example, an RF source power of 56 kW and a signal frequency of 13.56 MHz may be applied. In another example, a 56 kW power and 2 MHz frequency RF signal may be applied. Each one of the coils 130 receives the RF power supplied by the power source 148 and creates an electromagnetic field that energizes the precursor gases within the gas volumes 140. The energized process gases are then flowed through a plurality of openings 220 disposed through the gas flow diffusers 134 and into the processing region 126 towards the substrate 102.

At operation 540, a DC bias is applied to the substrate bias plate 160 as energized process gases are flowed into the processing region 126. The DC bias power is supplied by substrate bias power source 156 and filtered by the low pass filter 154. The DC bias output may be either pulsed or constant with either a positive or negative potential. Any suitable pulse rate or power level of DC bias may be supplied to the substrate bias plate 160. For example, a pulsed DC bias with a pulse rate of about 50 kHz to 500 kHz, such as about 100 kHz to about 400 kHz, may be supplied. For example, a pulsed DC bias with a pulse rate of about 250 kHz to about 300 kHz may be supplied. The pulsed or constant DC bias is provided at a power level within the range of about 50 W to about 1000 W, such as about 250 W to about 750 W. For example, the DC bias power is provided at a power level from about 400 W to about 600 W.

The application of the DC power across the substrate bias plate 160 biases plasma towards the substrate 102 by creating a local capacitively-coupled electric field, thus increasing ion bombardment on the substrate surface and enabling a film layer with modulated intrinsic film stress to form at operation 550. The use of DC substrate biasing at operation 540 enables modification of intrinsic film stress properties during large area HDP-CVD utilizing multi-coil ICP systems. In particular, DC biasing enables the formation of large area substrate film layers with decreased and uniform film stress levels across the film being deposited.

Other methods of film stress control either involve no substrate biasing or involve the application of an RF substrate bias power to modulate ion bombardment on the substrate surface. However, when implemented in HDP chambers with multi-coil ICP systems, these methods result in undesired film stress characteristics of the deposited film layers. For example, when no substrate bias is applied, the deposited film layers tend to exhibit undesired high tensile film stress levels.

Alternatively, when an RF substrate bias is applied, the deposited film layers tend to exhibit non-uniform film stress levels. Particularly, film stress of the substrate areas disposed directly below coils of a multi-coil ICP system tend to be modulated by the RF bias power, while substrate areas disposed below the showerhead structure frame remain largely unaffected. This non-uniformity is a result of the RF bias power penetrating through the plasma and coupling to the grounded showerhead structure frame disposed above. Thus, film stress is position dependent when an RF substrate bias is applied.

Comparatively, when a DC substrate bias is applied, modulation of film stress is not position dependent. Rather, the resulting film layer exhibits uniform film stress properties because the DC bias power does not couple to the grounded showerhead structure frame above. Thus, the plasma sheath is affected by the DC bias power and areas both below the showerhead structure frame and below the coils of a multi-coil ICP system are modulated substantially equally.

Embodiments of the disclosure include a method and apparatus capable of forming one or more layers of a film on a large area substrate. Plasma uniformity as well as gas (or precursor) flow is controlled by a combination of the configurations of the individual gas flow diffusers 134, the coils 130, and/or the flow controllers 142, 143 and 144. Film stress uniformity is controlled by the application of a DC substrate bias to a bias substrate platform 160 within the substrate support assembly 108.

While the foregoing is directed to embodiments of the present disclosure, other and further embodiments of the disclosure may be devised without departing from the basic scope thereof, and the scope thereof is determined by the claims that follow.

What is claimed is:

1. A plasma deposition chamber, comprising:
a showerhead having a plurality of perforated members, each of the perforated members supported by adjacent support members of a plurality of support members;
a plurality of dielectric plates disposed above the plurality of perforated members, each dielectric plate supported by the adjacent support members, wherein
a respective perforated member, a respective dielectric plate, and the adjacent support members define a gas volume, the gas volume in fluid communication with the adjacent support members; and
a respective dielectric plate, the showerhead, and the adjacent support members define a coil volume;
a plurality of inductive coils, each inductive coil supported by each dielectric plate in the coil volume; and
a substrate support assembly, the substrate support assembly comprising:
an electrostatic chuck assembly coupled to an electrostatic chucking power source, the electrostatic chuck assembly disposed at a top-most position of the substrate support assembly;
an insulation layer disposed at a bottom-most position of the substrate support assembly; and
a substrate bias plate coupled to a power source and a low pass filter disposed between the substrate bias plate and the power source, the substrate bias plate disposed between the electrostatic chuck assembly and the insulation layer.

2. The chamber of claim 1, wherein the support members include conduits formed therein for flowing the precursor gases.

3. The chamber of claim 2, wherein the support members further include coolant channels formed therein for flowing a coolant.

4. The chamber of claim 1, wherein a top surface of each dielectric plate is in contact with each of the inductive coils in the coil volume.

5. The chamber of claim 1, wherein the plurality of support members are arranged in a grid configuration separating each of the plurality of perforated members, dielectric plates, and inductive coils.

6. The chamber of claim 1, wherein each of the plurality of inductive coils is coupled to an RF type power source.

7. The chamber of claim 1, wherein the power source is a DC type power source configured to provide a constant DC bias to the substrate bias plate in either a positive or negative polarity.

8. The chamber of claim 7, wherein the DC bias is provided at a power level from about 50 W to about 1000 W.

9. The chamber of claim 1, wherein the power source is a DC type power source configured to provide a pulsed DC bias to the substrate bias plate in either a positive or negative polarity.

10. The chamber of claim 9, wherein the pulsed DC bias is pulsed at a frequency from about 50 kHz to about 500 kHz.

11. The chamber of claim 1, wherein the low pass filter prevents RF power supplied to the inductive coils from coupling with power source.

12. A plasma deposition chamber, comprising:
a showerhead having a plurality of perforated members, each of the perforated members supported by adjacent support members;
a plurality of inductive couplers;
a plurality of dielectric plates disposed above the plurality of perforated members, each dielectric plate supported by the adjacent support members, wherein
a respective perforated member, a respective dielectric plate, and the adjacent support members define a gas volume, the gas volume in fluid communication with the adjacent support members; and
a respective dielectric plate, the showerhead, and the adjacent support members define a coil volume, each inductive coupler supported by each dielectric plate in the coil volume; and
a substrate support assembly, the substrate support assembly comprising:
an electrostatic chuck assembly coupled to an electrostatic chucking power source, the electrostatic chuck assembly disposed at a top-most position of the substrate support assembly;
an insulation layer disposed at a bottom-most position of the substrate support assembly; and
a substrate bias plate coupled to a power source and a low pass filter disposed between the substrate bias plate and the power source, the substrate bias plate disposed between the electrostatic chuck assembly and the insulation layer.

13. The chamber of claim 12, wherein the power source is a DC type power source configured to provide a constant DC bias to the bias plate in either a positive or negative polarity.

14. The chamber of claim 12, wherein the power source is a DC type power source configured to provide a pulsed DC bias to the bias plate in either a positive or negative polarity.

15. The chamber of claim 12, wherein each of the plurality of perforated members and the plurality of support members includes an interface portion, and each interface portion includes one or more removable strips.

16. A plasma deposition chamber, comprising:
- a showerhead having a plurality of perforated members, each of the plurality of perforated members supported by adjacent support members of a plurality of support members, the plurality of support members separating each of the plurality of perforated members into a grid formation and having conduits formed therein for flowing one or more precursor gases;
- a plurality of dielectric plates disposed above the plurality of perforated members, each dielectric plate supported by the adjacent support members, wherein
    - a respective perforated member, a respective dielectric plate, and the adjacent support members define a gas volume, the gas volume in fluid communication with the adjacent support members; and
    - a respective dielectric plate, the showerhead, and the adjacent support members define a coil volume;
- a plurality of inductive coils, each inductive coil supported by each dielectric plate in the coil volume; and
- a substrate support assembly, the substrate support assembly comprising:
    - a substrate bias plate coupled to a bias power source and a low pass filter disposed between the substrate bias plate and the power source.

17. The chamber of claim 16, wherein the bias power source is a DC type power source configured to provide a constant DC bias to the substrate bias plate in either a positive or negative polarity.

18. The chamber of claim 17, wherein the DC bias is provided at a power level from about 50 W to about 1000 W.

19. The chamber of claim 16, wherein the bias power source is a DC type power source configured to provide a pulsed DC bias to the substrate bias plate in either a positive or negative polarity.

20. The chamber of claim 19, wherein the pulsed DC bias is pulsed at a frequency from about 50 kHz to about 500 kHz.

* * * * *